US012621932B2

(12) United States Patent
Shin et al.

(10) Patent No.: US 12,621,932 B2
(45) Date of Patent: May 5, 2026

(54) DISPLAY PANEL INCLUDING SIGNAL PADS WITH VARYING DIMENSIONS

(71) Applicant: Samsung Display Co., Ltd., Yongin-si (KR)

(72) Inventors: Dong Hee Shin, Anyang-si (KR);
Sunkwun Son, Suwon-si (KR);
Nahyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 17/352,009

(22) Filed: Jun. 18, 2021

(65) Prior Publication Data

US 2022/0059479 A1 Feb. 24, 2022

(30) Foreign Application Priority Data

Aug. 21, 2020 (KR) ......................... 10-2020-0105447

(51) Int. Cl.
*H05K 1/11* (2006.01)
*H01L 23/00* (2006.01)
(Continued)

(52) U.S. Cl.
CPC .............. *H05K 1/118* (2013.01); *H01L 24/06* (2013.01); *H05K 1/189* (2013.01); *H01L 24/32* (2013.01);
(Continued)

(58) Field of Classification Search
CPC ......... H01L 24/06; H01L 24/32; H01L 25/18; H01L 2224/0603; H01L 2224/06155;
(Continued)

(56) References Cited

U.S. PATENT DOCUMENTS

2003/0086048 A1* 5/2003 Ukita .................... G02F 1/1345
349/149
2006/0244741 A1 11/2006 Kimura et al.
(Continued)

FOREIGN PATENT DOCUMENTS

CN 101271802 A 9/2008
CN 103309069 A 9/2013
(Continued)

OTHER PUBLICATIONS

Korean Office Action corresponding to KR Application No. 10-2020-0105447, dated Feb. 23, 2026, together with English translation (22 pages).

(Continued)

*Primary Examiner* — Sue A Purvis
*Assistant Examiner* — John Patrick Cornely
(74) *Attorney, Agent, or Firm* — Womble Bond Dickinson (US) LLP

(57) ABSTRACT

A display panel includes: a display substrate including a display area and a pad area spaced apart from a side of the display area in a first direction; and first to (n)th signal pads (where n is an integer of 2 or more) in the pad area on the display substrate, extending in the first direction, and spaced apart from each other in a second direction perpendicular to the first direction, wherein a (k)th signal pad among the first to (n)th signal pads (where k is an integer between 1 and n) is between the first signal pad and the (n)th signal pad, wherein a length of each of (k)th to (n)th signal pads among the first to (n)th signal pads along the first direction gradually increases, and wherein a width of each of the (k)th to (n)th signal pads along the second direction gradually decreases.

16 Claims, 9 Drawing Sheets

(51) Int. Cl.
　　*H05K 1/189*　　　　(2026.01)
　　*H01L 25/18*　　　　(2023.01)
(52) U.S. Cl.
　　CPC ...... *H01L 25/18* (2013.01); *H01L 2224/0603*
　　　　　(2013.01); *H01L 2224/06155* (2013.01); *H01L*
　　　　　　　*2224/32227* (2013.01); *H05K 2201/094*
　　　　　(2013.01); *H05K 2201/10128* (2013.01)
(58) Field of Classification Search
　　CPC .......... H01L 2224/32227; H05K 1/118; H05K
　　　　　　　　　1/189; H05K 2201/094; H05K
　　　　　　　2201/10128; H05K 3/323; H05K 1/147;
　　　　　　　　G02F 1/13458; H10K 59/131; H10K
　　　　　　　　　　　　　　50/80; H10K 71/60
　　See application file for complete search history.

(56)　　　　　　References Cited

U.S. PATENT DOCUMENTS

2007/0080433　A1　　4/2007　Lai
2008/0231165　A1　　9/2008　Lee

2015/0009438　A1*　1/2015　Du ...................... G02F 1/1345
　　　　　　　　　　　　　　　　　　　　174/260
2019/0196632　A1　　6/2019　Ryu et al.
2019/0357367　A1*　11/2019　Chung .................. H05K 1/111

FOREIGN PATENT DOCUMENTS

| | | |
|---|---|---|
| CN | 107369692　A | 11/2017 |
| CN | 109935169　A | 6/2019 |
| CN | 110488545　A | 11/2019 |
| KR | 2003-0036078　A | 5/2003 |
| KR | 10-1218088　B1 | 1/2013 |
| KR | 10-2014-0087436　A | 7/2014 |
| KR | 10-1627245　B1 | 6/2016 |
| KR | 10-2019-0076091　A | 7/2019 |
| KR | 10-2019-0131156　A | 11/2019 |

OTHER PUBLICATIONS

Chinese Office Action corresponding to CN Application No. 202110659550.4, dated Mar. 13, 2026 (8 pages).

* cited by examiner

DISPLAY PANEL INCLUDING SIGNAL PADS WITH VARYING DIMENSIONS

CROSS-REFERENCE TO RELATED APPLICATION

The present application claims priority to and the benefit of Korean Patent Application No. 10-2020-0105447, filed on Aug. 21, 2020, in the Korean Intellectual Property Office, the entire content of which is hereby incorporated by reference.

BACKGROUND

1. Field

Aspects of some example embodiments of the present inventive concept relate to a display panel.

2. Description of Related Art

Recently, flat panel display devices such as liquid crystal display devices, organic light emitting display devices, etc., have been widely used. A display device may include pixels located in a display area and signal lines located in the display area and connected to the pixels. Also, the display device may further include signal pads and fan-out lines located around the display area and transmitting a signal and/or a voltage generated from the driving integrated circuit to the signal lines.

In order to implement a relatively narrow bezel, a width of the fan-out area in which the fan-out lines are may also be relatively narrow. However, as the number of fan-out lines connected to one driving integrated circuit increases, and as the number of driving integrated circuits used in a display panel increases due to large display devices, limits may be placed on the amount that the width of the fan-out area can be reduced.

The above information disclosed in this Background section is only for understanding of the background of the inventive concepts, and, therefore, it may contain information that does not constitute prior art.

SUMMARY

Aspects of some example embodiments of the present inventive concept relate to a display panel. For example, some embodiments of the present inventive concept relate to the display panel and a display device including the same.

Aspects of some embodiments of the present inventive concept include a display panel with relatively reduced dead space.

Aspects of some example embodiments of the present inventive concept also include a display panel in which contact failure between signal pads and signal terminals is relatively reduced.

Aspects of some example embodiments of the present inventive concept include a display device with relatively reduced dead space.

Additional features of the inventive concepts will be set forth in the description which follows, and in part will be apparent from the description, or may be learned by practice of the inventive concepts.

A display panel according to some embodiments may include a display substrate including a display area and a pad area spaced apart from a side of the display area in a first direction, and first to (n)th signal pads (where n is an integer of 2 or more) located in the pad area on the display substrate, extending in the first direction, and spaced apart from each other in a second direction perpendicular to the first direction. A (k)th signal pad among the first to (n)th signal pads (where k is an integer between 1 and n) is located between the first signal pad and the (n)th signal pad. A length of each of (k)th to (n)th signal pads among the first to (n)th signal pads in the first direction gradually increases. A width of each of the (k)th to (n)th signal pads in the second direction gradually decreases.

According to some embodiments, the first to (n)th signal pads are spaced apart from each other by a same distance in the second direction.

According to some embodiments, areas of the first to (n)th signal pads are the same as each other in a plan view.

According to some embodiments, each of the first to (n)th signal pads includes a first end adjacent to the side of the display area and a second end opposite to the first end.

According to some embodiments, a first reference line connecting first ends of first to (k-1)th signal pads among the first to (n)th signal pads and a second reference line connecting first ends of the (k) to (n)th signal pads are defined. Each of the first and second reference lines extends in a diagonal direction with respect to the second direction. The first and second reference lines are symmetrical to each other.

According to some embodiments, a third reference line connecting second ends of the first to (n)th signal pads is defined. The third reference line is parallel to the second direction.

According to some embodiments, a distance in the first direction between the side of the display area and a first end of each of the (k)th to (n)th signal pads gradually decreases.

According to some embodiments, distances in the first direction between the side of the display area and second ends of the (k)th to (n)th signal pads are the same as each other.

According to some embodiments, the display substrate further includes a fan-out area positioned between the side of the display area and the pad area. The display panel further includes first to (n)th signal lines located in the display area on the display substrate, and first to (n)th fan-out lines in the fan-out area on the display substrate and connecting the first to (n)th signal pads and corresponding ones of the first to (n)th signal lines, respectively. A (k)th fan-out line among the first to (n)th fan-out lines connects the (k)th signal pad and a (k)th signal line among the first to (n)th signal lines.

According to some embodiments, each of the (k)th signal pad, the (k)th fan-out line, and the (k)th signal line extends in the first direction.

According to some embodiments, each of the (n)th signal pad and the (n)th signal line extends in the first direction. The (n)th fan-out line extends in a diagonal direction with respect to the first direction.

According to some embodiments, an end of each of the first to (n)th fan-out lines contacts a corresponding one of the first to (n)th signal pads. Another end of each of the first to (n)th fan-out lines contacts a corresponding one of the first to (n)th signal lines. A distance in the first direction between the side of the display area and the end of each of (k)th to (n)th fan-out lines among the first to (n)th fan-out lines gradually decreases.

According to some embodiments, lengths of the first to (n)th fan-out lines are the same as each other.

According to some embodiments, the display panel further comprising at least one power pad in the pad area on the display substrate and spaced apart from the (n)th signal pad in the second direction.

According to some embodiments, a length of the power pad in the first direction is the same as a length of the (n)th signal pad in the first direction.

According to some embodiments, a width of the power pad in the second direction is the same as a width of the (n)th signal pad in the second direction.

A display panel according to some embodiments may include a display substrate including a display area and a plurality of pad areas spaced apart from a side of the display area in a first direction and arranged in a second direction perpendicular to the first direction, and a plurality of pad portions in corresponding ones of the plurality of pad areas on the display substrate, respectively. Each of the plurality of pad portions includes a plurality of signal pads extending in the first direction and spaced apart from each other in the second direction. A length of each of the plurality of signal pads in the first direction gradually increases closer to an end and another end of each of the plurality of pad areas. A width of each of the plurality of signal pads in the second direction gradually decreases closer to the end and the another end of each of the plurality of pad areas.

According to some embodiments, the plurality of signal pads included in each of the plurality of pad portions are spaced apart from each other by a same distance in the second direction.

According to some embodiments, areas of the plurality of signal pads included in each of the plurality of pad portions are the same as each other in a plan view.

A display device according to some embodiments may include a display panel including a display substrate including a display area and a pad area spaced apart from a side of the display area in a first direction, and a plurality of signal pads in the pad area on the display substrate, a flexible circuit film including a base film, and a plurality of signal terminals on the base film and overlapping each of the plurality of signal pads, and a conductive film between the display panel and the flexible circuit film. The plurality of signal terminals include first to (n)th signal terminals (where n is an integer of 2 or more) extending in the first direction, and spaced apart from each other in a second direction perpendicular to the first direction. A (k)th signal terminal among the first to (n)th signal terminals (where k is an integer between 1 and n) is between the first signal terminal and the (n)th signal terminal. A length of each of (k)th to (n)th signal terminals among the first to (n)th signal terminals in the first direction gradually increases. A width of each of the (k)th to (n)th signal terminals in the second direction gradually decreases.

The display panel according to some embodiments may include the signal pads that gradually increase in length outwardly from the central portion of the pad area. Accordingly, width of the fan-out area may be relatively reduced. Therefore, it is possible to implement a narrow bezel by reducing the width of the dead space.

The display device according to some embodiments may include the signal pads spaced apart from each other in a direction perpendicular to the length direction, and the signal terminals overlapping corresponding ones of the signal pads, respectively. Therefore, even in a large display device in which a plurality of driving integrated circuits are used, contact failure between the signal pads and the signal terminals may be prevented or reduced.

It is to be understood that both the foregoing general description and the following detailed description are merely examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate aspects of some example embodiments of the invention, and together with the description serve to explain the inventive concepts.

FIG. 7 is a plan view illustrating a power pad included in the display panel of FIG. 4 according to some embodiments.

FIG. 8 is an enlarged plan view illustrating the area "A" of a flexible circuit film included in the display device of FIG. 2 according to some embodiments.

DETAILED DESCRIPTION

Illustrative, non-limiting example embodiments will be more clearly understood from the following detailed description in conjunction with the accompanying drawings.

Figure 1:
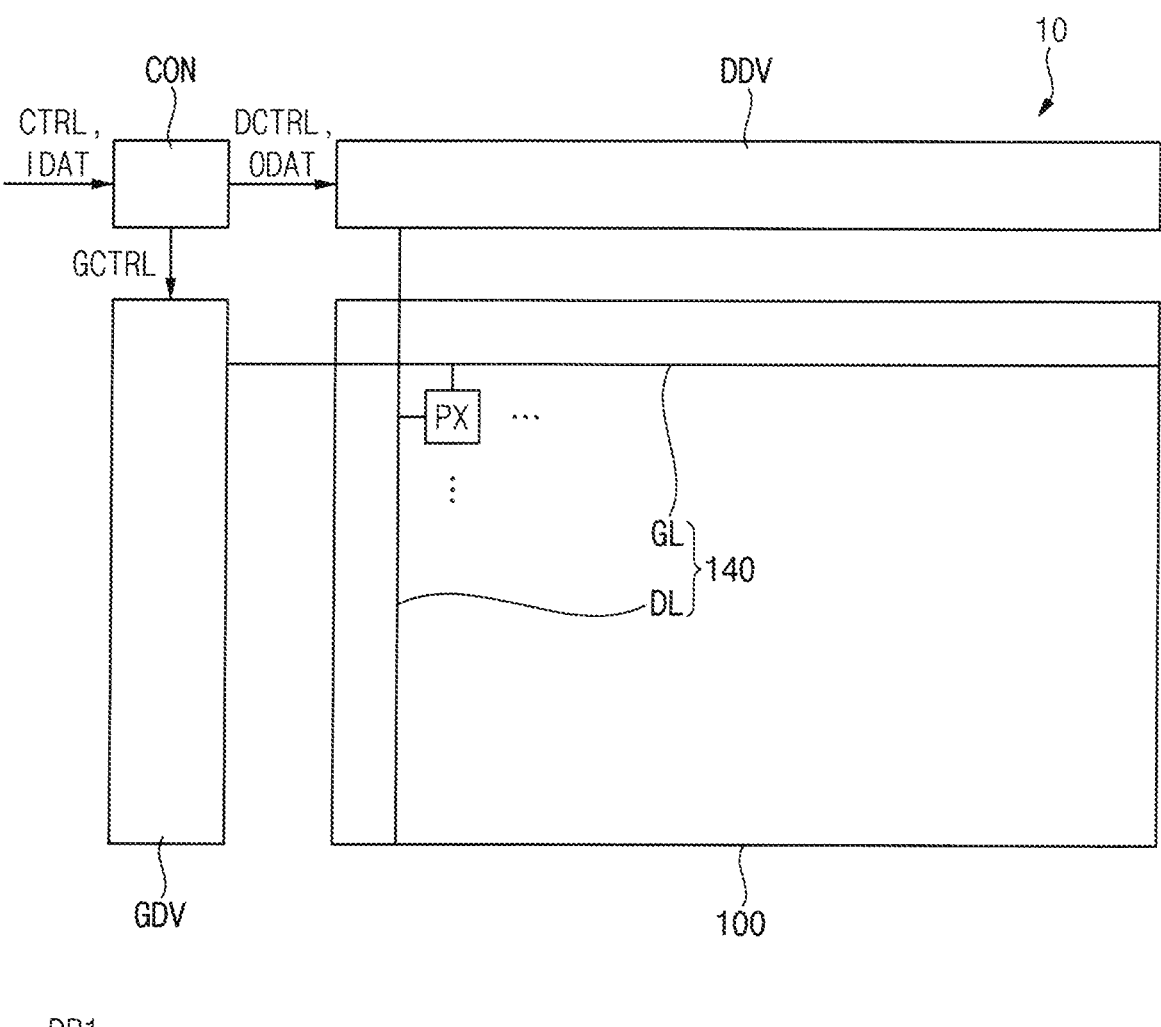
FIG. 1 is a block diagram illustrating a display device according to some embodiments.

FIG. 1 is a block diagram illustrating a display device according to some embodiments.

Referring to FIG. 1, a display device 10 may include a display panel 100 and a panel driver. The panel driver may include a driving controller CON, a gate driver GDV, and a data driver DDV.

The display panel 100 may include a plurality of pixels PX and a plurality of signal lines 140 electrically connected to the pixels PX. The signal lines 140 may include gate lines GL and data lines DL. For example, each of the data lines DL may extend in a first direction DR1. Each of the gate lines GL may extend in a second direction DR2 crossing the first direction DR1. The pixels PX may emit light by receiving signals and/or voltages from the signal lines.

The driving controller CON may generate a gate control signal GCTRL, a data control signal DCTRL, and output image data ODAT based on an input image data IDAT and an input control signal CTRL provided from an external device. For example, the input image data IDAT may be RGB data including red image data, green image data, and blue image data (although embodiments are not limited thereto, and the input image data may include any other suitable image data format, for example, RGBG, etc.). The input control signal CTRL may include a master clock signal and an input data enable signal. The input control signal CTRL may further include a vertical synchronization signal and a horizontal synchronization signal.

The gate driver GDV may generate gate signals based on the gate control signal GCTRL provided from the driving controller CON. For example, the gate control signal GCTRL may include a vertical start signal and a gate clock signal. The gate driver GDV may sequentially output the gate signals to the gate lines GL. For example, the gate driver GDV may include gate driving integrated circuits.

According to some embodiments, the signal lines 140 may further include connection lines electrically connecting the gate driver GDV and the gate lines GL. For example, each of the connection lines may extend in the first direction DR1 and may be spaced apart from each other in the second direction DR2. Each of the connection lines may electrically connect a gate line GL among the gate lines GL and the gate driver GDV. That is, each of the gate lines GL may receive the gate signals from the gate driver GDV through a corresponding one of the connection lines. In this case, the gate driver GDV and the data driver DDV may be arranged in the same direction (e.g. the first direction) with respect to the display panel 100.

The data driver DDV may generate data voltages based on the data control signal DCTRL and the output image data ODAT provided from the driving controller CON. For example, the data control signal DCTRL may include an output data enable signal, a horizontal start signal, and a load signal. The data driver DDV may output the data voltages to the data lines DL. For example, the data driver DDV may include data driving integrated circuits.

Figure 2:
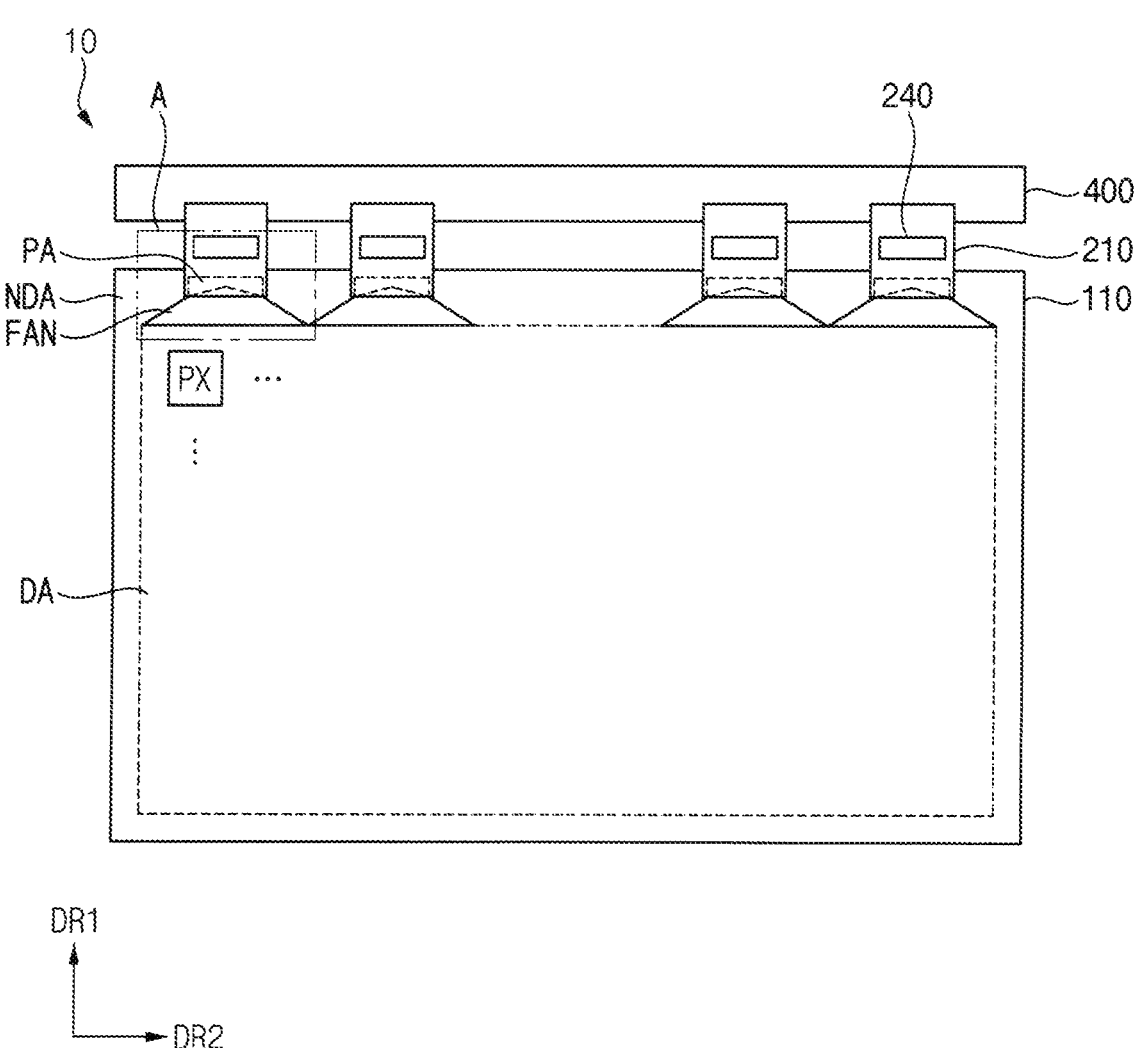
FIG. 2 is a plan view illustrating the display device of FIG. 1 according to some embodiments.
Figure 3:
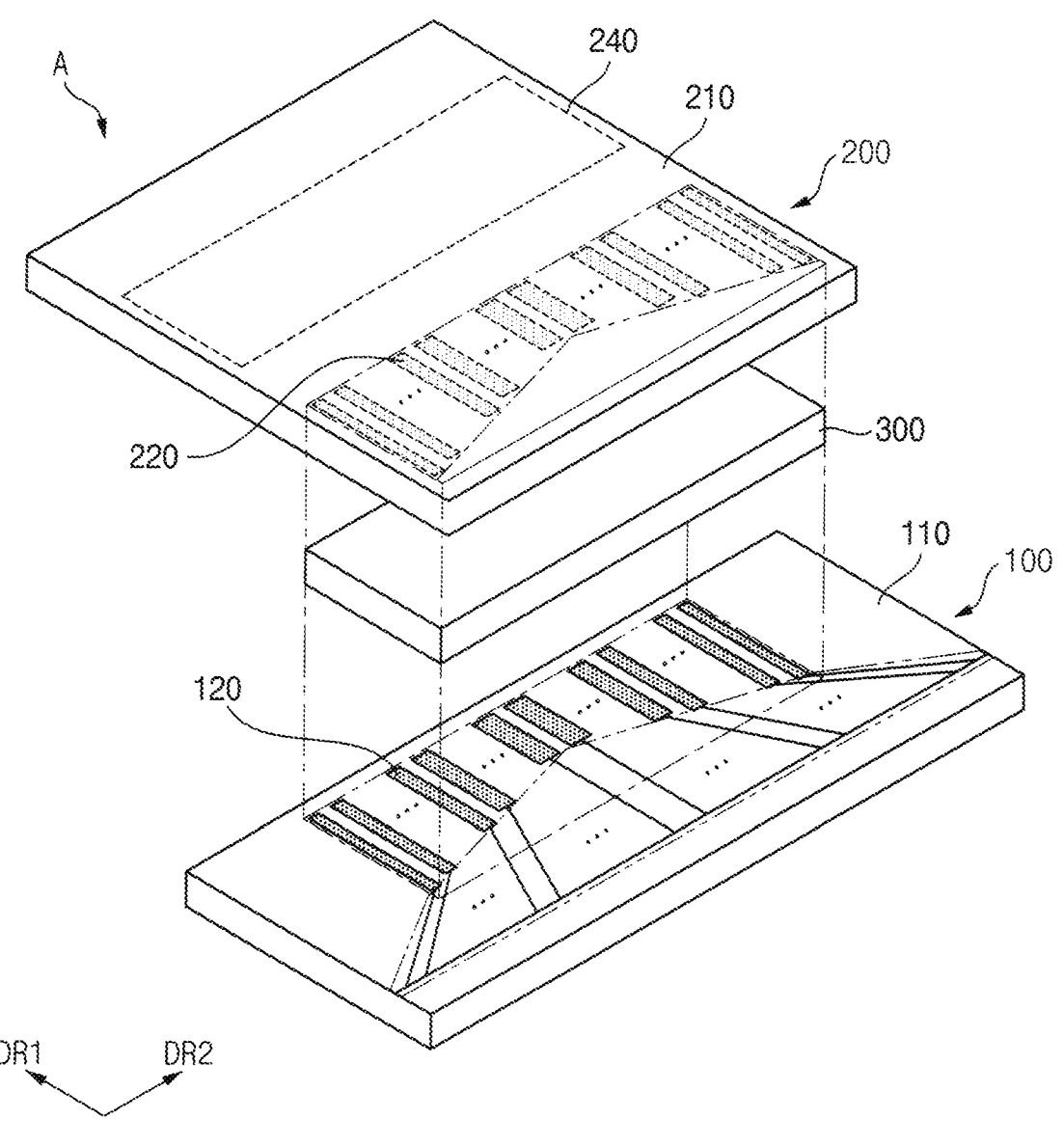
FIG. 3 is an exploded perspective view illustrating an area "A" of FIG. 2 according to some embodiments.

FIG. 2 is a plan view illustrating the display device of FIG. 1. FIG. 3 is an exploded perspective view illustrating an area "A" of FIG. 2.

Referring to FIGS. 2 and 3, according to some embodiments, the display device 10 may include a display panel 100, a flexible circuit film 200, a conductive film 300, and a printed circuit board 400.

The display panel 100 may include a display substrate 110 and at least one pad portion. The display substrate 110 may include a display area DA and a non-display area NDA positioned around the display area DA (e.g., in a periphery or outside a footprint of the display area DA). Images may be displayed in the display area DA.

The non-display area NDA may include a pad area PA and a fan-out area FAN positioned between the display area DA and the pad area PA.

The pixels PX and the signal lines 140 may be located in the display area DA on the display substrate 110. For example, the pixels PX may be arranged in a matrix form or configuration in the first direction DR1 and the second direction DR2. Each of the pixels PX may include at least one thin film transistor and a pixel electrode connected thereto. The thin film transistor may include a gate electrode extending from each of the gate lines GL, a source electrode extending from each of the data lines DL, and a drain electrode connected to the pixel electrode.

The pad portion may be located in the pad area PA on the display substrate 110. The pad portion may include a plurality of signal pads 120. The signal pads 120 may be located on an upper surface of the display substrate 110. For example, the signal pads 120 may include gate signal pads and data signal pads. The gate signal pads may be electrically connected to corresponding ones of the gate lines GL, respectively. The data signal pads may be electrically connected to corresponding ones of the data lines DL, respectively. For example, the pad portion may further include at least one power pad or dummy pad.

According to some embodiments, as shown in FIG. 2, the display substrate 110 may include a plurality of pad areas PA. The display panel 100 may include a plurality of pad portions. Each of the pad portions may be located in a corresponding one of the pad areas PA on the display substrate 110.

For example, as shown in FIG. 2, the pad areas PA may be located on a side of the display substrate 110. The pad areas PA may be spaced apart from a side of the display area DA in the first direction DR1 and may be arranged along the second direction DR2. The side of the display area DA may be adjacent to the flexible circuit film 200. For another example, the pad areas PA may be located on another side of the display substrate 110 facing or adjacent to the side.

The flexible circuit film 200 may include a base film 210, a terminal portion located on the base film 210, and at least one driving integrated circuit 240 located on the base film 210. For example, as shown in FIG. 2, the display device 10 may include a plurality of flexible circuit films 200.

For example, as shown in FIG. 2, an end portion (or a first end) of the base film 210 may overlap the display panel 100, and another end portion (or a second end) of the base film 210 may overlap the printed circuit board 400. The base film 210 may include or be formed of one or more flexible materials. Accordingly, the printed circuit board 400 may be bent toward a lower surface of the display panel 100 by the flexible circuit film 200.

The terminal portion may be located under the base film 210. The terminal portion may overlap with the end portion of the base film 210. That is, the terminal portion may be located under the base film 210 to overlap the display panel 100. For example, the terminal portion may overlap the pad portion. The terminal portion may include a plurality of signal terminals 220. The signal terminals 220 may be located on the lower surface of the base film 210. The signal terminals 220 may include gate signal terminals and data signal terminals. The signal terminals 220 may be electrically connected to corresponding ones of the signal pads 120, respectively. For example, the terminal portion may further include at least one power terminal or a dummy terminal.

The driving integrated circuit 240 may be the gate driving integrated circuit or the data driving integrated circuit. For example, the gate driving integrated circuit may be electrically connected to the gate signal terminals. The data driving integrated circuit may be electrically connected to the data signal terminals. For example, one flexible circuit film 200 may include a plurality of driving integrated circuits 240.

The conductive film 300 may be located between the display panel 100 and the flexible circuit film 200. For example, the conductive film 300 may include an anisotropic conductive film (ACF). For example, the conductive film 300 may overlap the pad portion of the display panel 100 and the terminal portion of the flexible circuit film 200. The signal terminals 220 may be electrically connected to corresponding ones of the signal pads 120 respectively by the conductive film 300.

The gate signals generated by the gate driving integrated circuit may be output to the gate lines GL through the gate signal terminals, the conductive film 300 and the gate signal pads. The data voltages generated by the data driving integrated circuit may be output to the data lines DL through the data signal terminals, the conductive film 300 and the data signal pads.

The printed circuit board 400 may be located at the another (or the second) end portion of the base film 210. According to some embodiments, the printed circuit board

400 may include the driving controller CON. That is, according to some embodiments, the driving controller CON may be mounted on or integrated with the printed circuit board 400.

Figure 4:
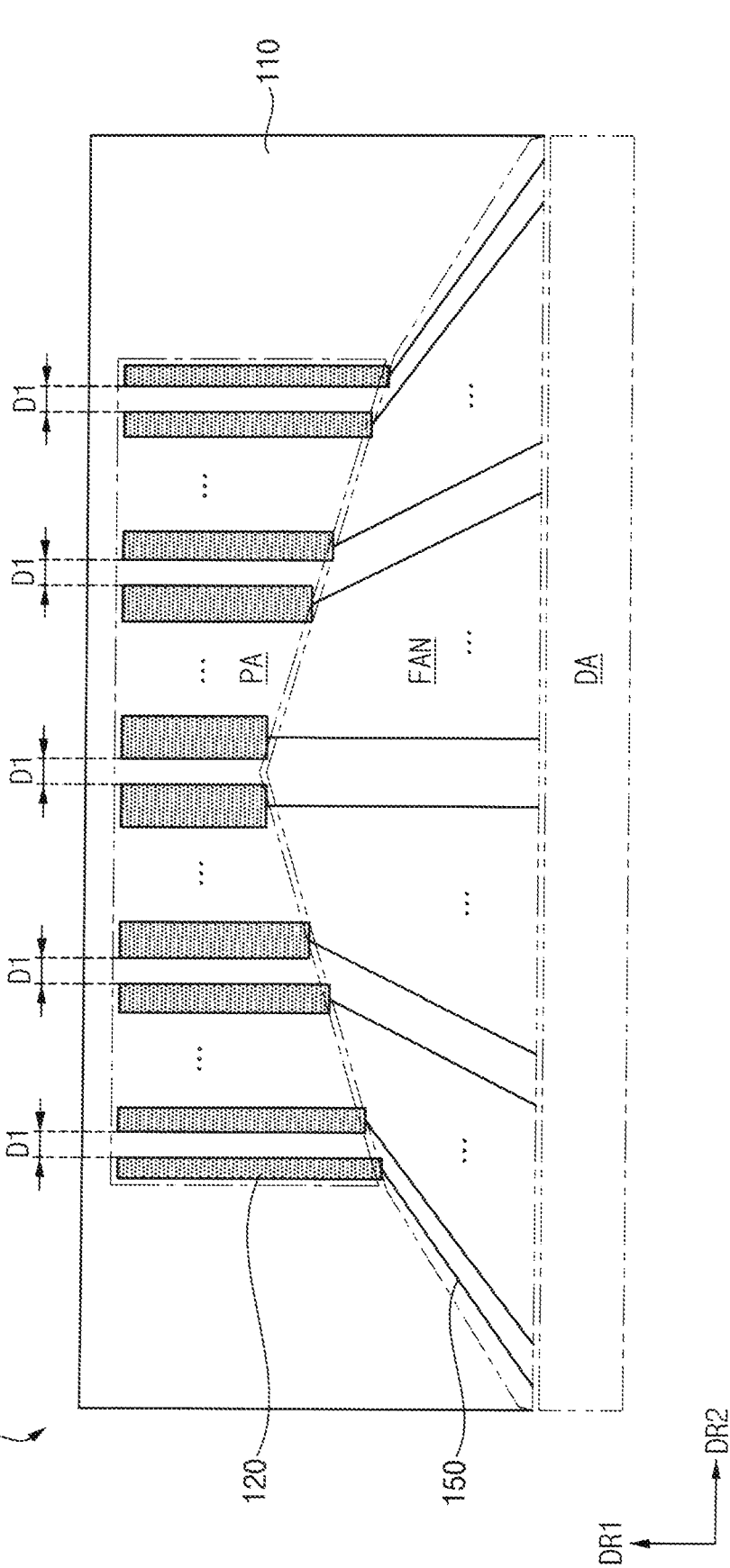
FIG. 4 is an enlarged plan view illustrating the area "A" of a display panel included in the display device of FIG. 2 according to some embodiments.
Figure 5:
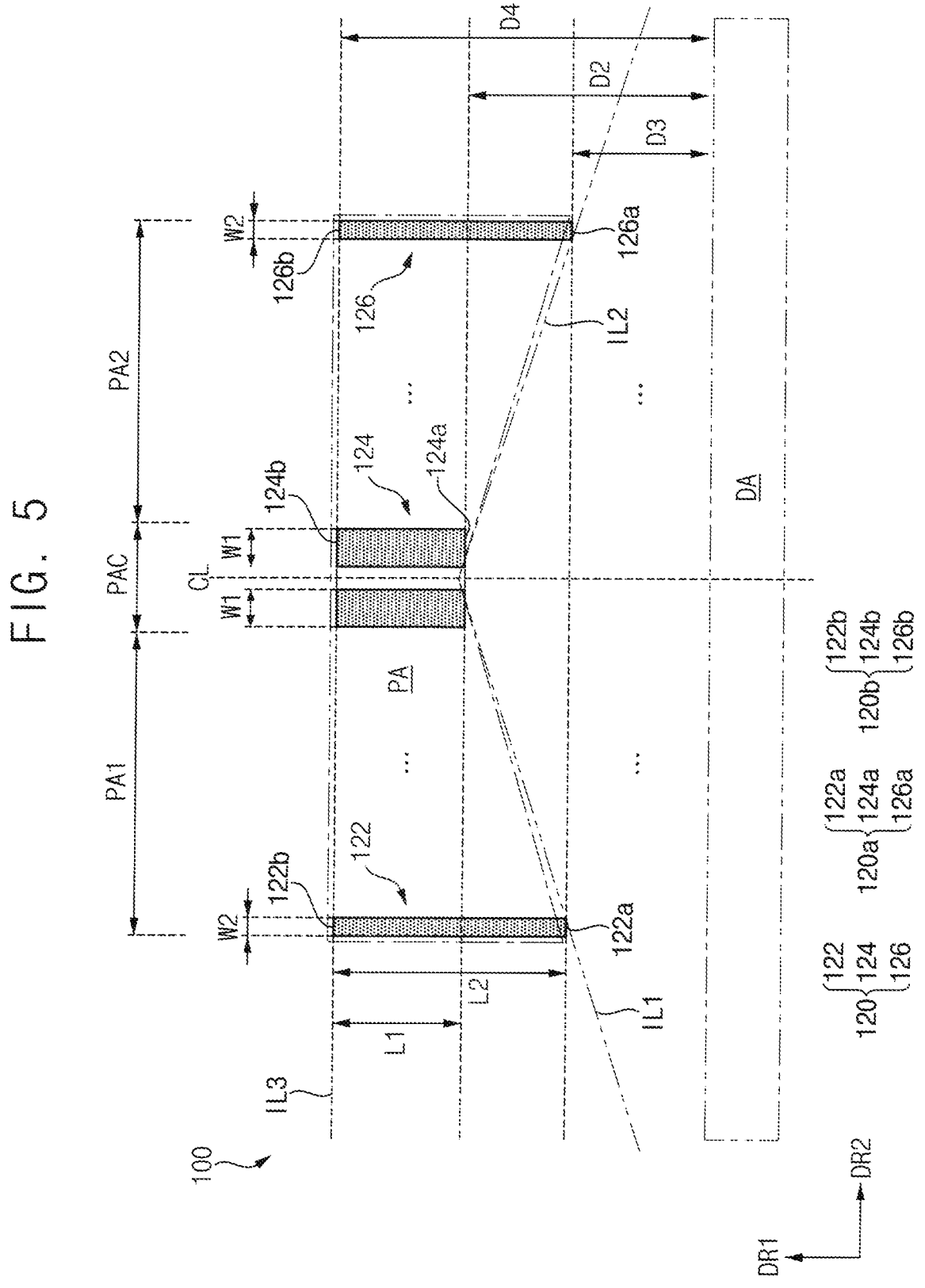
FIG. 5 is a plan view illustrating signal pads included in the display panel of FIG. 4 according to some embodiments.

FIG. 4 is an enlarged cross-sectional view illustrating an area "A" of FIG. 3A. FIG. 5 is an enlarged cross-sectional view illustrating an area "B" of FIG. 3B.

The plurality of signal pads 120 included in a pad portion among the plurality of the pad portions will now be described in more detail with reference to FIGS. 4 and 5. It may be applied to each of the plurality of the pad portions located in the plurality pad areas PA.

Referring to FIGS. 4 and 5, the pad portion may be located in the pad area PA on the display substrate 110. For example, the pad area PA may be spaced apart from the side of the display area DA in the first direction DR1. The pad portion may include a plurality of signal pads 120. For example, the pad portion may include first to (n)th signal pads (where n is an integer of 2 or more).

Each of the signal pads 120 may extend in the first direction DR1. For example, each of the first to (n)th signal pads may extend in the first direction DR1. That is, the longer sides of the signal pads 120 may extend in, or be parallel to, the first direction DR1.

The signal pads 120 may be arranged long and spaced apart from each other in the second direction DR2. For example, the first to (n)th signal pads may be spaced apart from each other in the second direction DR2. The second direction DR2 may vertically or perpendicularly cross the first direction DR1.

According to some embodiments, the signal pads 120 may be spaced apart from each by substantially the same distance in the second direction DR2. For example, the first to (n)th signal pads may be spaced apart by substantially the same distance D1 in the second direction DR2.

For example, as shown in FIG. 5, the pad area PA may have a central portion PAC, a first side portion PA1 positioned in a direction opposite to the second direction DR2 from the central portion PAC, and a second side portion PA2 positioned in the second direction DR2 from PAC.

According to some embodiments, a first signal pad 122 among the first to (n)th signal pads may be located at the first side portion PA1 of the pad area PA. For example, the first signal pad 122 may be located at an end portion of the pad area PA in the direction opposite to the second direction DR2. A (k)th (where k is an integer between 1 and n) signal pad 124 among the first to (n)th signal pads may be located at the central portion PAC of the pad area PA. A (n)th signal pad 126 among the first to (n)th signal pads may be located at the second side portion PA2 of the pad area PA. For example, the (n)th signal pad 126 may be located at another end of the pad area PA in the second direction DR2. The (k)th signal pad 124 may be located between the first signal pad 122 and the (n)th signal pad 126.

According to some embodiments, as shown in FIG. 5, signal pads located at the first side portion PA1 of the pad area PA and signal pads located at the second side portion PA2 of the pad area PA may be symmetrical to each other. For example, a center line CL of the pad area PA extending in the first direction DR1 positioned in the central portion PAC may be defined. The first signal pad 122 and the (n)th signal pad 126 may be symmetrical to each other with respect to the center line CL. A (k-1)th signal pad among the first to (n)th signal pads and the (k)th signal pad 124 may be symmetrical to each other with respect to the center line CL.

According to some embodiments, the signal pads located at the first side portion PA1 of the pad area PA and the signal pads located at the second side portion PA2 of the pad area PA may be asymmetric to each other with respect to the center line CL.

According to some embodiments, a length of each of the signal pads 120 in the first direction DR1 may gradually increase outwardly from the central portion PAC of the pad area PA. A width of each of the signal pads 120 in the second direction DR2 may gradually decrease outwardly from the central portion PAC of the pad area PA. In other words, along a direction from the center portion PAC to the first side portion PA1 or the second side portion PA2, the length of each of the signal pads 120 in the first direction DR1 may gradually increase, and the width of each of the signal pads 120 in the second direction DR2 may gradually decrease. That is, the length of each of the signal pads 120 in the first direction DR1 may gradually increase closer to an end and another end of the pad area PA. The width of each of the signal pads 120 in the second direction DR2 may gradually decrease closer to the end and the another end of the pad area PA. The end of the pad area PA may be a second direction DR2 side end (e.g. a right end), and the another end may be the direction opposite to the second direction DR2 side end (e.g. a left end).

For example, a length of each of (k)th to (n)th signal pads among the first to (n)th signal pads in the first direction DR1 may gradually increase, and a width of each of the (k)th to (n)th signal pads in the second direction DR2 may gradually decrease. That is, a length L1 of the (k)th signal pad 124 in the first direction DR1 may be less than a length L2 of the (n)th signal pad 126 (or the first signal pad 122) in the first direction DR1. A width W1 of the (k)th signal pad 124 in the second direction DR2 may be greater than a width W2 of the (n)th signal pad 126 (or the first signal pad 122) in the second direction DR2.

According to some embodiments, areas of the signal pads 120 located at the pad area PA on the display substrate 110 may be substantially the same as each other. That is, the signal pads 120 may have substantially the same area in a plan view (e.g. a plan view parallel to an upper surface of the display substrate 110).

For example, areas of the first to (n)th signal pads in the plan view may be substantially the same as each other. That is, an area of the first signal pad 122, an area of the (k)th signal pad 124, and an area of the (n)th signal pad 126 in the plan view may be substantially the same as each other. In other words, the length of each of the (k)th to (n)th signal pads in the first direction DR1 may gradually increase, and the width of each of the (k)th to (n)th signal pads in the second direction DR2 may gradually decrease while maintaining substantially the same area.

Each of the signal pads 120 may include a first end 120a adjacent to a side of the display area DA and a second end 120b opposite to the first end 120a. For example, the side of the display area DA may be an end of the display area DA adjacent to the pad area PA. The second end 120b may be positioned in the first direction DR1 from the first end 120a.

According to some embodiments, a reference line connecting the first ends 120a of the signal pads 120 may have a shape bent toward the first direction DR1.

For example, as shown in FIG. 5, a first reference line IL1 connecting the first ends of first to (k-1) signal pads among the first to (n)th signal pads and a second reference line IL2 connecting the first ends of the (k)th to (n)th signal pads may be defined. In this case, each of the first and second reference lines IL1 and IL2 may extend in a diagonal direction with respect to the first direction DR1 and the second direction DR2. In addition, the first and second reference lines IL1 and IL2 may be symmetrical to each other with respect to the center line CL.

According to some embodiments, a distance in the first direction DR1 between the side of the display area DA and the first end 120a of each of the signal pads 120 may gradually decrease outwardly from the central portion PAC of the pad area PA.

For example, a distance in the first direction DR1 between the side of the display area DA and the first end of each of the (k)th to (n)th signal pads may gradually decrease. That is, a distance D2 in the first direction DR1 between the side of the display area DA and the first end 124a of the (k)th signal pad 124 may be greater than a distance D3 in the first direction DR1 between the side of the display area DA and the first end 126a of the (n)th signal pad 126.

According to some embodiments, a reference line connecting the second ends 120b of the signal pads 120 may be parallel to the second direction DR2.

For example, as shown in FIG. 5, a third reference line IL3 connecting the second ends of the first to (n)th signal pads may be defined. In this case, the third reference line IL3 may extend parallel to the second direction DR2.

According to some embodiments, distances in the first direction DR1 between the side of the display area DA and the second ends 120b of the signal pads 120 may be substantially the same as each other.

For example, distances in the first direction DR1 between the side of the display area DA and the second ends of the (k)th to (n)th signal pads may be substantially the same as each other. That is, a distance D4 in the first direction DR1 between the side of the display area DA and the second end 124b of the (k)th signal pad 124 may be substantially the same as a distance D4 in the first direction DR1 between the side of the display area DA and the second end 126b of the (n)th signal pad 126.

Figure 6:
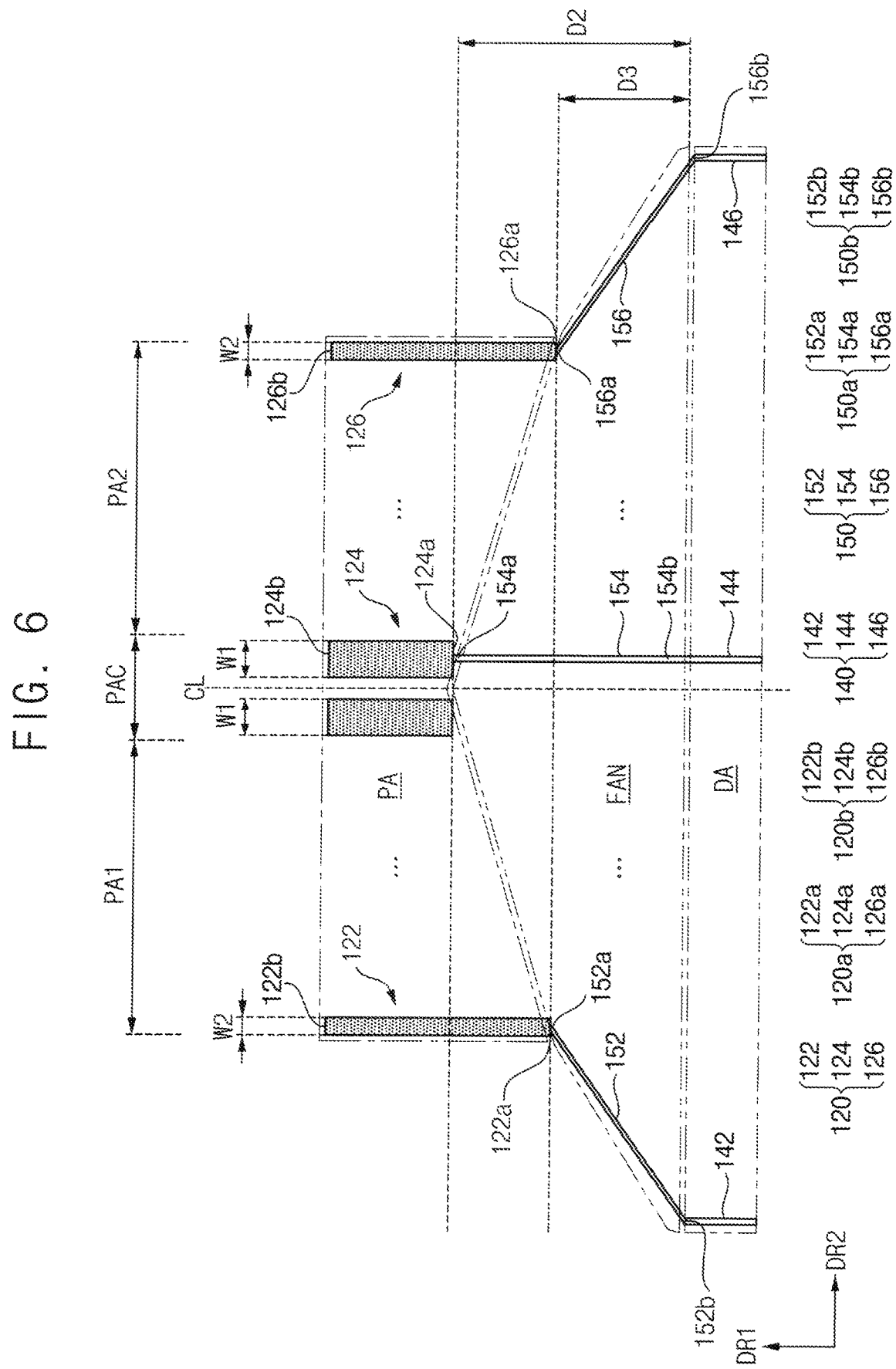
FIG. 6 is a plan view illustrating fan-out lines included in the display panel of FIG. 4 according to some embodiments.

FIG. 6 is a plan view illustrating fan-out lines included in the display panel of FIG. 4.

Referring to FIG. 6, the display panel 100 may further include a plurality of fan-out lines 150 located in the fan-out area FAN on the display substrate 110. The fan-out area FAN may be positioned between the side of the display area DA and the pad area PA. For example, the fan-out area FAN may be positioned in the first direction DR1 from the display area DA.

The fan-out lines 150 may electrically connect the signal lines 140 located in the display area DA and corresponding ones of the signal pads 120 located in the pad area PA, respectively. The signal lines 140 may include first to (n)th signal lines. For example, the fan-out lines 150 may include first to (n)th fan-out lines electrically connecting the first to (n)th signal lines and corresponding ones of the first to (n)th signal pads, respectively.

For example, a (m)th among the first to (n)th fan-out lines (where m is an integer between 1 and n) may electrically connect a (m)th signal line among the first to (n)th signal lines and a (m)th signal pad among the first to (n)th signal pads. That is, a first fan-out line 142 among the first to (n)th fan-out lines may electrically connect the first signal line 142 and the first signal pad 122. A (k)th fan-out line 144 among the first to (n)th fan-out lines may electrically connect the (k)th signal line 144 and the (k)th signal pad 124. A (n)th fan-out line 146 among the first to (n)th fan-out lines may electrically connect the (n)th signal line 146 and the (n)th signal pad 126.

According to some embodiments, a first end 150a of each of the fan-out lines 150 may contact a corresponding one of the signal pads 120, and a second end 150b opposite the first end 150a may contact a corresponding one of the signal lines 140.

That is, the first end of each of the first to (n)th fan-out lines may contact a corresponding one of the first to (n)th signal pads, and the second end of each of the first to (n)th fan-out lines may contact a corresponding one of the first to (n)th signal lines. In other words, the first end 152a of the first fan-out line 152 may contact the first signal pad 122 and the second end 152b may contact the first signal line 142. The first end 154a of the (k)th fan-out line 154 may contact the (k)th signal pad 124, and the second end 154b may contact the (k)th signal line 144. The first end 156a of the (n)th fan-out line 156 may contact the (n)th signal pad 126, and the second end 156b may contact the (n)th signal line 146.

According to some embodiments, a distance in the first direction DR1 between a side of the display area DA and the first end 150a of each of the fan-out lines 150 may gradually decrease outwardly from the central portion PAC of the pad area PA. The side of the display area DA may be an end of the display area DA adjacent to the fan-out area FAN.

For example, a distance in the first direction DR1 between the side of the display area DA and the first end of each of the (k)th to (n)th fan-out lines may gradually decrease. That is, a distance D2 in the first direction DR1 between the side of the display area DA and the first end 154a of the (k)th fan-out line 154 may be greater than a distance D3 in the first direction DR1 between the side of the display area DA and the first end 156a of the (n)th fan-out line 156. In other words, the fan-out area FAN may include a protrusion portion protruding toward the pad area PA. At least a portion of each of the fan-out lines 150 located in a central portion of the fan-out area FAN may be positioned in the protrusion portion of the fan-out area FAN.

According to some embodiments, in order to prevent or reduce a resistance deviation between the fan-out lines 150 each other, lengths of the fan-out lines 150 may be substantially the same as each other. That is, lengths of the first to (n)th fan-out lines 150 may be substantially the same as each other.

For example, a distance in the second direction DR2 between the signal pads 120 located in the pad area PA may be less than a distance in the second direction DR2 between the signal lines 140 located in the display area DA. Accordingly, as the distance from the center of the pad area PA increases, each of the fan-out lines 150 may extend diagonally with respect to the first direction DR1 outwardly from the central portion of the fan-out area FAN.

For example, as shown in FIG. 6, at least a portion of each of the first and (n)th fan-out lines 152 and 156 may extend substantially diagonally with respect to the first direction DR1. That is, the first signal pad 122 may substantially extend in the first direction DR1, the first fan-out line 152 may substantially extend in a diagonal direction inclined at a first angle with respect to the first direction DR1, the first signal line 142 may substantially extend in the first direction DR1. The (n)th signal pad 126 may substantially extend in the first direction DR1, the (n)th fan-out line 156 may substantially extend in a diagonal direction inclined at a second angle with respect to the first direction DR1, the (n)th signal line 146 may substantially extend in the first direction DR1. For example, the first fan-out line 152 and the (n)th fan-out line 156 may be symmetrical with respect to the center line CL.

For example, at least a portion of the (k)th fan-out line 154 may extend substantially parallel to the first direction DR1.

That is, the (k)th signal pad 124, the (k)th fan-out line 154, and the (k)th signal line 144 may extend substantially parallel to the first direction DR1.

According to some embodiments, at least one of the fan-out lines 150 may include a pattern portion for reducing a length deviation. The pattern portion may include a zigzag pattern. For example, according to a difference between the length L1 of the (k)th signal pad 124 and the length L2 of the (n)th signal pad 126, a difference between the distance D3 between the side of the display area DA and the first end 124a of the (k)th signal pad 124 and the distance D2 between the side of the display area DA and the first end 126a of the (n)th signal pad 126, an angle in which a straight line extending the first and second ends 156a and 156b of the (n)th fan-out line 156 is inclined with respect to the first direction DR1, and the like, a linear distance between the first end 150a and the second end 150b may be different for each of the fan-out lines 150. Accordingly, when each of the fan-out lines 150 is formed in a straight line, a resistance deviation of each of the fan-out lines 150 may occur due to the length deviation of each of the fan-out lines 150. Accordingly, in order to reduce the length deviation, at least one of the fan-out lines 150 may include the pattern portion.

For example, a length of the pattern portion included in each of the fan-out lines 150 may gradually decrease outwardly from the central portion of the fan-out area FAN. That is, when a linear distance between the first and second ends 154a and 154b of the (k)th fan-out line 154 is less than a linear distance between the first and second ends 156a and 156b of the (n)th fan-out line 156, a length of the pattern portion included in the (k)th fan-out line 154 may be greater than a length of the pattern portion included in the (n)th fan-out line 156. In this case, the (n)th fan-out line 156 may not include the pattern part. That is, the (n)th fan-out line 156 may be formed in a straight line.

According to some embodiments, each of the fan-out lines 150 may not include the pattern portion. That is, each of the fan-out lines 150 may be formed in a straight line. For example, when the linear distance between the first and second ends 154a and 154b of the (k)th fan-out line 154 is substantially the same as the linear distance between the first and second ends 156a and 156b of the (n)th fan-out line 156, each of the (k)th and (n)th fan-out lines 154 and 156 may not include the pattern portion.

In a conventional display device, a difference between a linear distance between both ends of a fan-out line located in a central portion of a fan-out area and a linear distance between both ends of a fan-out line located in an outer portion of the fan-out area (that is, a linear distance between an end of the signal pad and an end of the signal line) may be greater. Accordingly, in order to reduce a length deviation between the fan-out lines, the fan-out line located in the central portion of the fan-out area may include a pattern portion having a relatively greater length. Accordingly, a width of the fan-out area (that is, a distance between a pad area and a display area) is relatively increased, so that a dead space may become wider. In addition, in a conventional display device in which each of signal pads extends diagonally to reduce a dead space, a contact failure between the signal pads and signal terminals may occur. That is, when the signal pads extending diagonally are connect to corresponding ones of the signal terminals extending diagonally respectively, a contact failure in which a signal pad is connected to a non-corresponding one of the signal terminals may occur. In particular, in a large display device including a plurality of pad areas and a plurality of flexible circuit films, the contact failure between the signal pads and the signal terminals may be often occurred.

The display device 10 according to some embodiments may include the signal pads 120 that gradually increase in length outwardly from the central portion PAC of the pad area PA. Accordingly, a difference between the distance between the first and second ends 154a and 154b of the (k)th fan-out line 154 located in the central portion of the fan-out area FAN and the distance between the first and second ends 156a and 156b of the (n)th fan-out line 156 located in the outer portion of the fan-out area FAN may be prevented or reduced. Accordingly, the display device 10 may eliminate the pattern portion included in the fan-out lines 150 or may reduce the length of the pattern portion. Accordingly, widths of the fan-out area FAN and the dead space in the first direction DR1 may be relatively reduced. In addition, the display device 10 according to some embodiments may include the signal pads 120 spaced apart from each other in a direction perpendicular to the length direction, and the signal terminals 220 overlapping corresponding ones of the signal pads 120, respectively. Therefore, even when the display device includes a plurality of pad areas PA and a plurality of flexible circuit films 200, contact failure between the signal pads 120 and the signal terminals 220 may be prevented or reduced.

Figure 7:
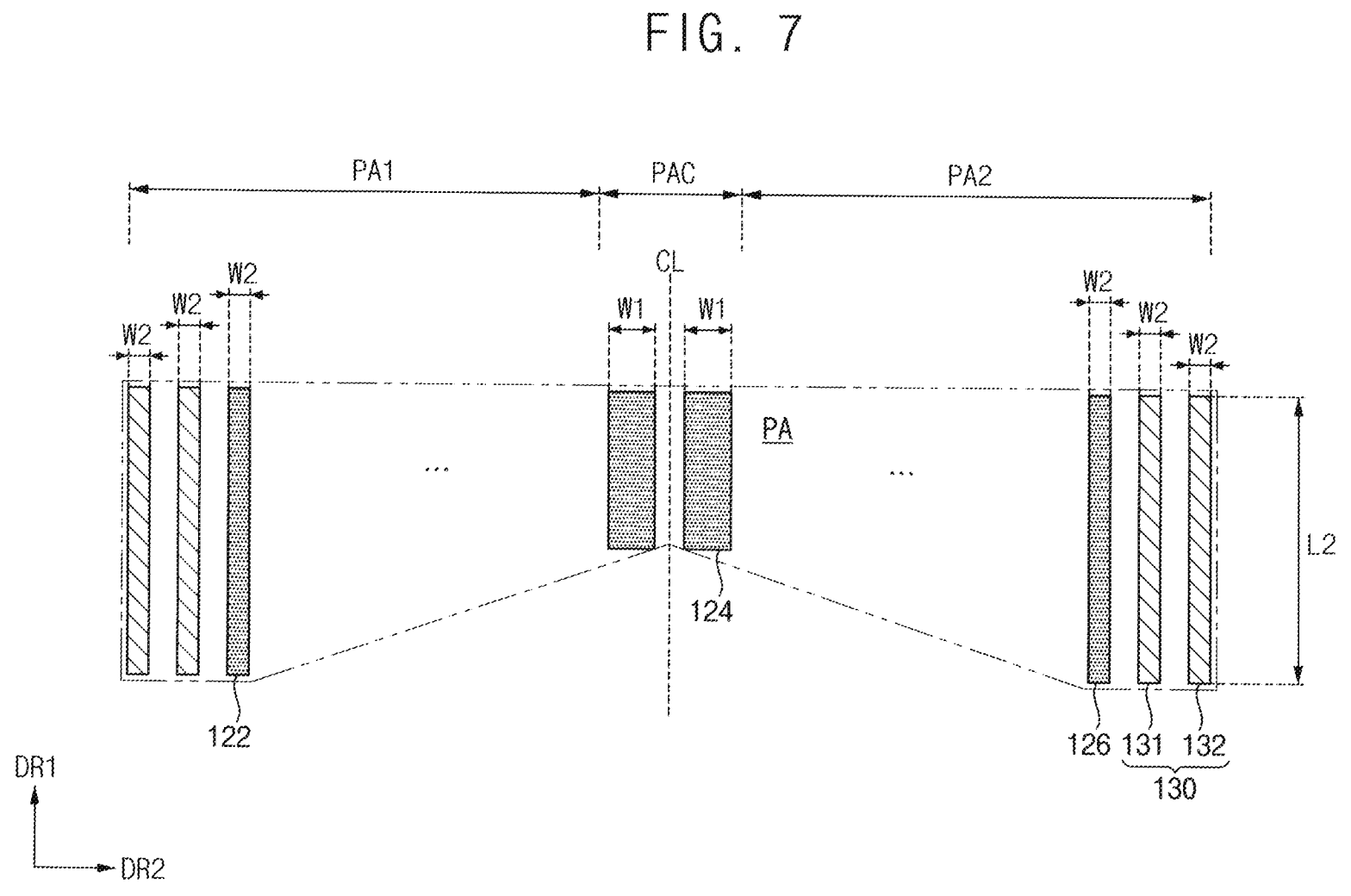

FIG. 7 is a plan view illustrating a power pad included in the display panel of FIG. 4.

Referring to FIG. 7, according to some embodiments, the pad portion located in the pad area PA on the display substrate 110 may further include at least one power pad 130. For example, the power pad 130 may include a first power pad 131 and/or a second power pad 132. The first power pad 131 may be electrically connected to a high power voltage (ELVDD) line, and the second power pad 132 may be electrically connected to a low power voltage (ELVSS) line.

For example, the high power voltage ELVDD may be greater than the low power voltage ELVSS. The high power voltage ELVDD may be a high power voltage, and the low power voltage ELVSS may be a low power voltage.

According to some embodiments, the power pad 130 may be located in outer portions of the pad area PA. That is, the power pad 130 may be located outside the signal pads 120. In other words, as shown in FIG. 7, the power pad 130 located at the first side portion PA1 of the pad area PA may spaced apart from the first signal pad 122 in the direction opposite to the second direction DR2. The power pad 130 located at the second side portion PA2 of the pad area PA may spaced apart from the n(th) signal pad 126 in the second direction DR2.

According to some embodiments, the power pad 130 may extend in the first direction DR1. That is, the power pad 130 may extend parallel to each of the signal pads 120.

According to some embodiments, a length of the power pad 130 in the first direction DR1 may be substantially the same as a length of an adjacent signal pad 120 in the first direction DR1. That is, a length L2 of the power pad 130 located at the first side portion PA1 of the pad area PA in the first direction DR1 may be substantially the same as the length L2 of the first signal pad 122 in the first direction DR1. A length L2 of the power pad 130 located at the second side portion PA2 of the pad area PA in the first direction DR1 may be substantially the same as the length L2 of the n(th) signal pad 126 in the first direction DR1.

According to some embodiments, a width of the power pad 130 in the second direction DR2 may be substantially the same as a width of the adjacent signal pad 120 in the second direction DR2. That is, a width W2 of the power pad 130 located at the first side portion PA1 of the pad area PA in the second direction DR2 may be substantially the same as the width W2 of the first signal pad 122 in the second direction DR2. A width W2 of the power pad 130 located at the second side portion PA2 of the pad area PA in the second direction DR2 may be substantially the same as the width W2 of the n(th) signal pad 126 in the second direction DR2.

According to some embodiments, a distance in the second direction DR2 between the power pad 130 and the adjacent signal pad 120 may be substantially the same as a distance D1 in which the signal pads 120 are spaced apart from each other in the second direction DR2.

Figure 8:
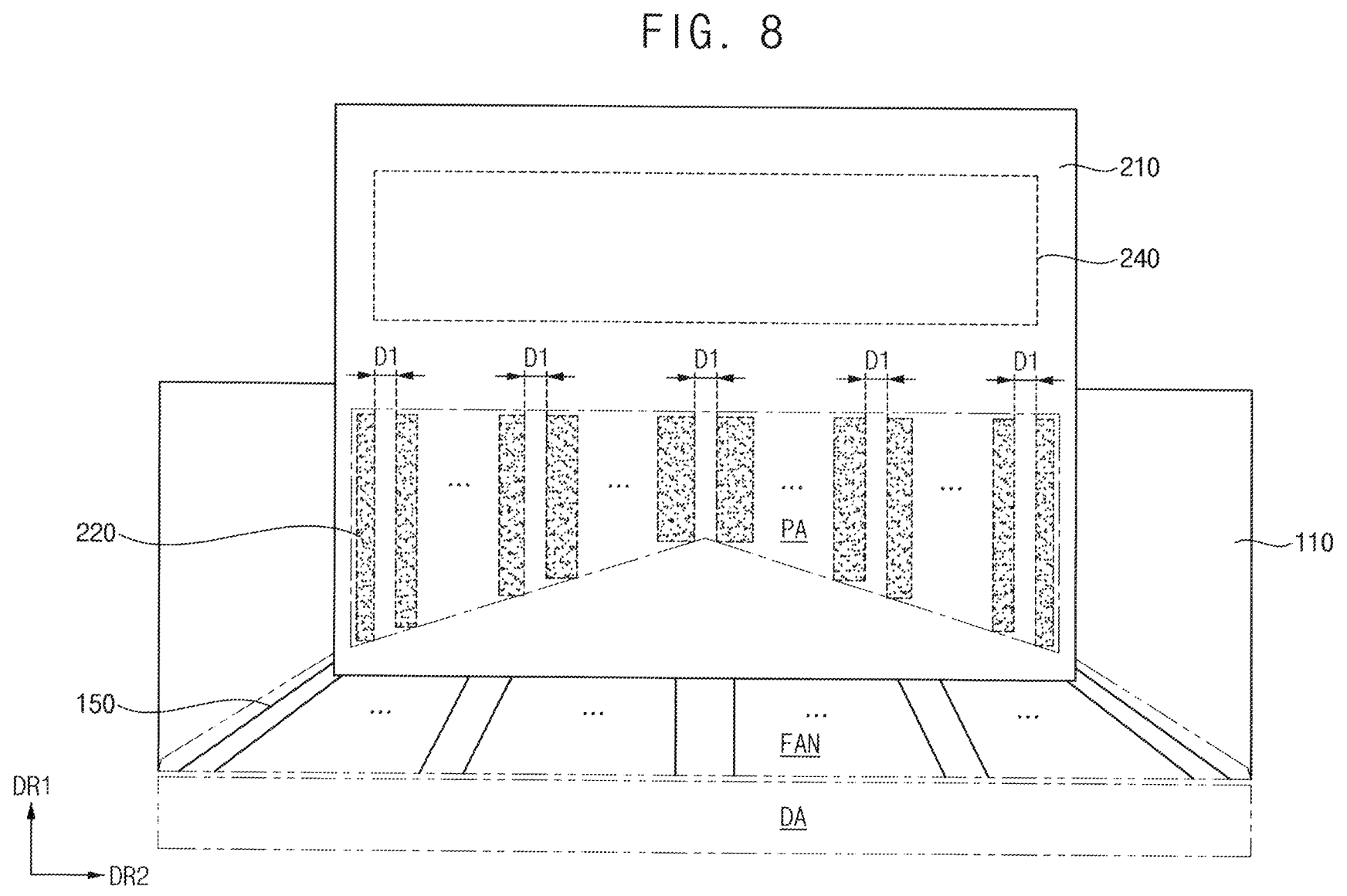
Figure 9:
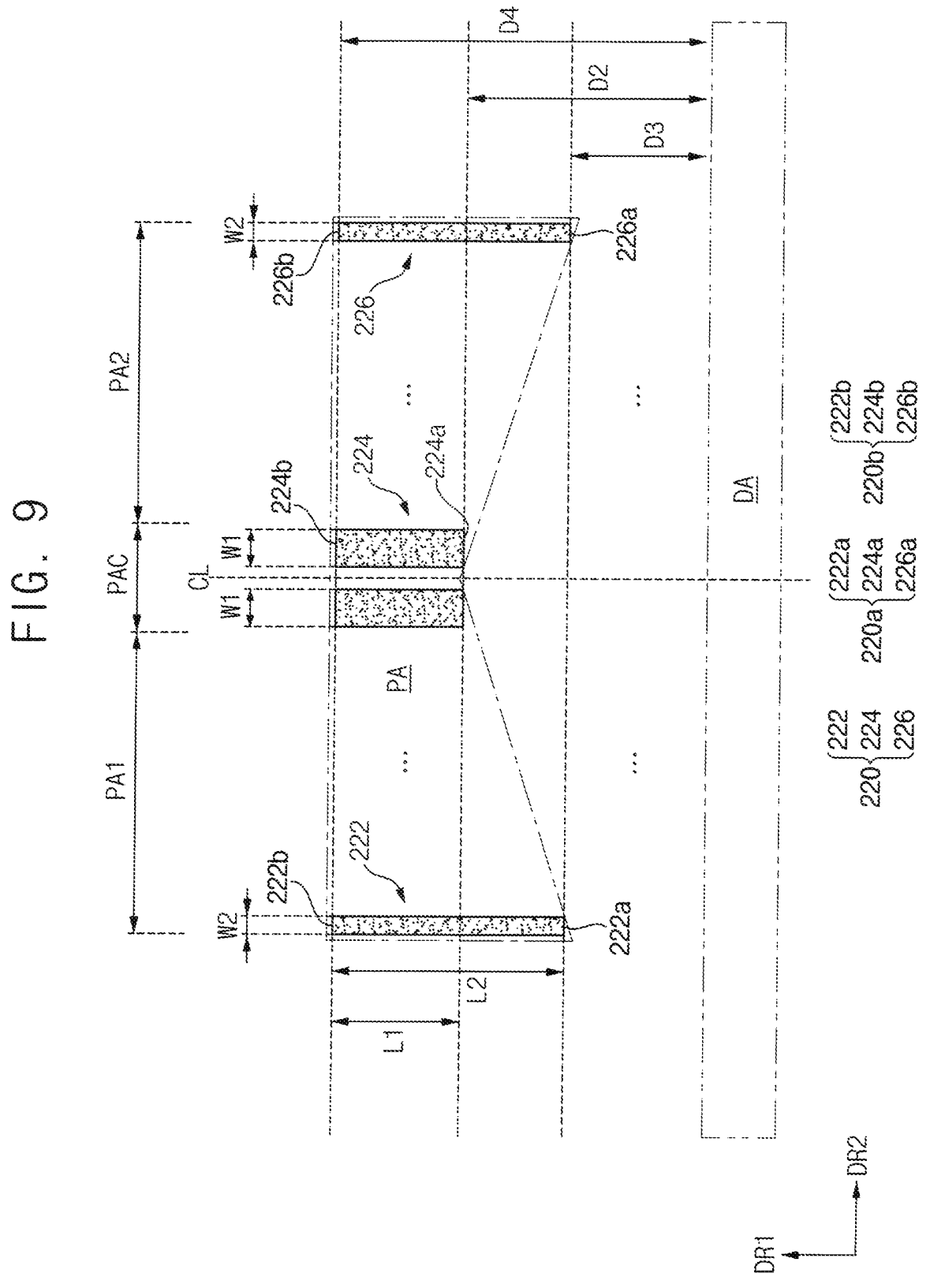
FIG. 9 is a plan view illustrating signal terminals included in the flexible circuit film of FIG. 8 according to some embodiments.

FIG. 8 is an enlarged plan view illustrating the area "A" of a flexible circuit film included in the display device of FIG. 2. FIG. 9 is a plan view illustrating signal terminals included in the flexible circuit film of FIG. 8.

Referring to FIGS. 8 and 9, the signal terminals 220 electrically connected to the driving integrated circuit 240 may be located under the base film 210 to overlap corresponding ones of the signal pads 120, respectively. That is, the signal terminals 220 may be positioned on the pad area PA. The signal terminals 220 may be electrically connected to the corresponding ones of the signal pads 120, respectively.

The signal terminals 220 may be substantially the same as or similar to the signal pads 120 described with reference to FIGS. 4 and 5. For example, each of the signal terminals 220 may extend in the first direction DR1. The signal terminals 220 may include first to (n)th signal terminals spaced apart from each other at substantially the same distance D1 in the second direction DR2. The first to (n)th signal terminals may be electrically connected to the corresponding ones of the first to (n)th signal pads, respectively.

According to some embodiments, the (k)th signal terminal 224 of the first to (n)th signal terminals may be located in the central portion PAC of the pad area PA. For example, a length of each of (k)th to (n)th signal terminals among the first to (n)th signal terminals in the first direction DR1 may gradually increase, and a width of each of the (k)th to (n)th signal terminals in the second direction DR2 may gradually decrease. For example, the area of each of the plurality of signal terminals 220 on the base film 210 may be substantially the same. That is, an area of each of the plurality of signal terminals 220 on a plane (eg, the lower surface of the base film 210) may be substantially the same. For example, areas of the signal terminals 220 located under the base film 210 may be substantially the same as each other. That is, the signal terminals 220 may have substantially the same area in a plan view (e.g. a plan view parallel to a lower surface of the base film 210).

According to some embodiments, each of the signal terminals 220 may include a first end 220a adjacent to the side of the display area DA and a second end 220b opposite to the first end 220a. That is, the second end 220b may be adjacent to the driving integrated circuit 240.

According to some embodiments, a distance in the first direction DR1 between the side of the display area DA and the first end 220a of each of the signal terminals 220 may gradually decrease outwardly from the central portion PAC of the pad area PA. In other words, a distance in the first direction DR1 between a side of the driving integrated circuit 240 adjacent to the terminal portion and the first end 220a of each of the signal terminals 220 may gradually increase outwardly from the central portion PAC of the pad area PA.

According to some embodiments, distances in the first direction DR1 between the side of the display area DA and the second ends 220b of the signal terminals 220 may be substantially the same as each other. In other words, distances in the first direction DR1 between the side of the driving integrated circuit 240 and the second ends 220b of the signal terminals 220 may be substantially the same as each other.

Although aspects of certain example embodiments and implementations have been described herein, other example embodiments and modifications will be apparent from this description. Accordingly, embodiments according to the inventive concepts are not limited to such example embodiments, but rather to the broader scope of the appended claims and various obvious modifications and equivalent arrangements as would be apparent to a person of ordinary skill in the art.

What is claimed is:

1. A display panel comprising:
   a display substrate including a display area and a pad area spaced apart from a side of the display area in a first direction; and
   first to (n)th signal pads (where n is an integer of 3 or more) immediately adjacent to each other in sequence in the pad area on the display substrate, each extending in the first direction, and spaced apart from each other in a second direction perpendicular to the first direction,
   wherein a (k)th signal pad among the first to (n)th signal pads (where k is an integer between 1 and n) is between the first signal pad and the (n) th signal pad,
   wherein a length of each of (k)th to (n)th signal pads among the first to (n)th signal pads along the first direction gradually increases in the first direction and signal pads from among the (k)th to (n)th signal pads that have different lengths in the first direction each extend parallel to each other,
   wherein a width of each of the (k)th to (n)th signal pads along the second direction gradually decreases,
   wherein each of the first to (n)th signal pads includes a first end adjacent to the side of the display area and a second end opposite to the first end,
   wherein a distance in the first direction between the side of the display area and a first end of each of the (k)th to (n)th signal pads gradually decreases,
   wherein the display substrate further includes a fan-out area between the side of the display area and the pad area,
   wherein the display panel further includes:
   first to (n)th signal lines in the display area on the display substrate; and
   first to (n)th fan-out lines in the fan-out area on the display substrate and connecting the first to (n)th signal pads and corresponding ones of the first to (n)th signal lines, respectively, and
   wherein the first to (n)th fan-out lines have a same length as each other.

2. The display panel of claim 1, wherein the first to (n)th signal pads are spaced apart from each other by a same distance in the second direction.

3. The display panel of claim 1, wherein the first to (n)th signal pads have a same area in a plan view.

4. The display panel of claim 1, wherein a first reference line connecting first ends of first to (k−1) th signal pads among the first to (n)th signal pads and a second reference line connecting first ends of the (k) to (n)th signal pads are defined, wherein each of the first and second reference lines extends in a diagonal direction with respect to the second direction, and wherein the first and second reference lines are symmetrical to each other.

5. The display panel of claim 1, wherein a third reference line connecting second ends of the first to (n)th signal pads is defined, wherein the third reference line is parallel to the second direction.

6. The display panel of claim 1, wherein distances in the first direction between the side of the display area and second ends of the (k)th to (n)th signal pads are the same as each other.

7. The display panel of claim 1, wherein a (k)th fan-out line among the first to (n)th fan-out lines connects the (k)th signal pad and a (k)th signal line among the first to (n)th signal lines.

8. The display panel of claim 7, wherein each of the (k)th signal pad, the (k)th fan-out line, and the (k) th signal line extends in the first direction.

9. The display panel of claim 7, wherein each of the (n)th signal pad and the (n)th signal line extends in the first direction, wherein the (n)th fan-out line extends in a diagonal direction with respect to the first direction.

10. The display panel of claim 7, wherein an end of each of the first to (n)th fan-out lines contacts a corresponding one of the first to (n)th signal pads, wherein another end of each of the first to (n)th fan-out lines contacts a corresponding one of the first to (n)th signal lines, wherein a distance in the first direction between the side of the display area and the end of each of (k)th to (n)th fan-out lines among the first to (n)th fan-out lines gradually decreases.

11. The display panel of claim 1, further comprising at least one power pad in the pad area on the display substrate and spaced apart from the (n)th signal pad in the second direction.

12. The display panel of claim 11, wherein a length of the power pad in the first direction is the same as a length of the (n)th signal pad in the first direction.

13. The display panel of claim 11, wherein a width of the power pad in the second direction is the same as a width of the (n)th signal pad in the second direction.

14. A display panel comprising:

a display substrate including a display area and a plurality of pad areas spaced apart from a side of the display area in a first direction and arranged in a second direction perpendicular to the first direction; and a plurality of pad portions in corresponding ones of the plurality of pad areas on the display substrate, respectively, wherein each of the plurality of pad portions includes first to (n)th signal pads (where n is an integer of 3 or more) immediately adjacent to each other in sequence, each extending in the first direction, and spaced apart from each other in the second direction, wherein a (k)th signal pad among the first to (n)th signal pads (where k is an integer between 1 and n) is between the first signal pad and the (n)th signal pad, wherein a length of each of (k)th to (n)th signal pads among the first to (n)th signal pads along the first direction gradually increases in the first direction and signal pads from among the (k)th to (n)th signal pads that have different lengths in the first direction each extend parallel to each other, wherein a width of each of the (k)th to (n)th signal pads along the second direction gradually decreases, wherein each of the first to (n)th signal pads includes a first end adjacent to the side of the display area and a second end opposite to the first end, and wherein a distance in the first direction between the side of the display area and a first end of each of the (k)th to (n)th signal pads gradually decreases, wherein the display substrate further includes a plurality of fan-out areas between the side of the display area and the plurality of pad areas, wherein the display panel further includes:

first to (n)th signal lines in the display area on the display substrate; and first to (n)th fan-out lines in each of the plurality of fan-out areas on the display substrate and connecting the first to (n)th signal pads and corresponding ones of the first to (n)th signal lines, respectively, and wherein the first to (n)th fan-out lines have a same length as each other.

15. The display panel of claim 14, wherein the first to (n)th signal pads included in each of the plurality of pad portions are spaced apart from each other by a same distance in the second direction.

16. The display panel of claim 14, wherein the first to (n)th signal pads included in each of the plurality of pad portions have a same area in a plan view.

*    *    *    *    *